(12) United States Patent
Murakami et al.

(10) Patent No.: US 8,023,355 B2
(45) Date of Patent: Sep. 20, 2011

(54) NONVOLATILE MEMORY DEVICE

(75) Inventors: Tetsuya Murakami, Tokyo (JP);
Nobuyoshi Nara, Kanagawa (JP);
Kenichi Imamiya, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 404 days.

(21) Appl. No.: 12/332,487

(22) Filed: Dec. 11, 2008

(65) Prior Publication Data

US 2009/0154280 A1    Jun. 18, 2009

(30) Foreign Application Priority Data

Dec. 13, 2007    (JP) ................................ 2007-322361

(51) Int. Cl.
*G11C 5/14*    (2006.01)
(52) U.S. Cl. ........................................ 365/226; 365/228
(58) Field of Classification Search .................. 365/226, 365/228, 189.09
See application file for complete search history.

(56) References Cited

U.S. PATENT DOCUMENTS

| | | | | |
|---|---|---|---|---|
| 5,511,183 | A | * | 4/1996 | Ohmido .......................... 714/14 |
| 7,205,682 | B2 | * | 4/2007 | Kuramori ........................ 307/80 |
| 7,376,012 | B2 | | 5/2008 | Kawamoto et al. |

FOREIGN PATENT DOCUMENTS

JP    2006-48777    2/2006

* cited by examiner

*Primary Examiner* — Vu Le
(74) *Attorney, Agent, or Firm* — Oblon, Spivak, McClelland, Maier & Neustadt, L.L.P.

(57) ABSTRACT

A nonvolatile memory device includes a nonvolatile memory and a controller unit for the nonvolatile memory. The nonvolatile memory and the controller unit include a first logic section and a second logic section, respectively. The nonvolatile memory includes a voltage detector configured to detect a power supply voltage externally supplied to the nonvolatile memory and the controller unit, and an output of the detection is supplied to the first logic section of the nonvolatile memory provided with the voltage detector, and also to the second logic section of the controller unit and/or a logic section of at least one added nonvolatile memory via a buffer amplifier, simultaneously.

5 Claims, 7 Drawing Sheets

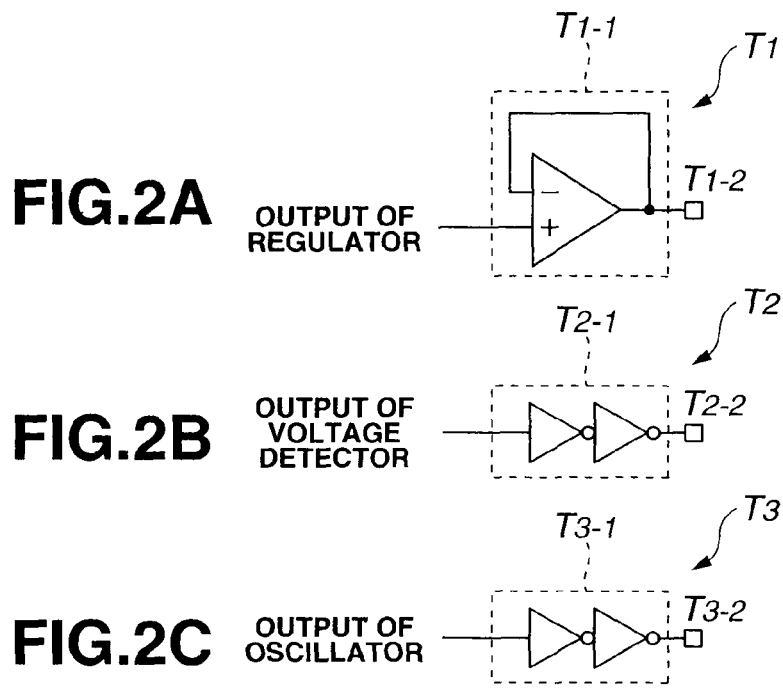
FIG.2A OUTPUT OF REGULATOR
FIG.2B OUTPUT OF VOLTAGE DETECTOR
FIG.2C OUTPUT OF OSCILLATOR
FIG.3
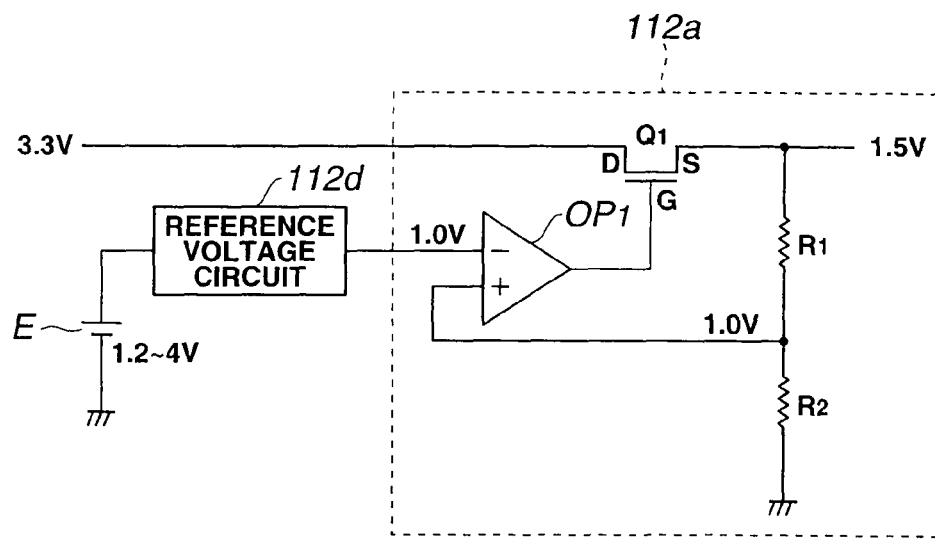

NONVOLATILE MEMORY DEVICE

CROSS REFERENCE TO RELATED APPLICATION

This application is based upon and claims the benefit of priority from the prior Japanese Patent Application No. 2007-322361 filed in Japan on Dec. 13, 2007; the entire contents of which are incorporated herein by reference.

BACKGROUND OF THE INVENTION

1. Field of the Invention

The present invention relates to a nonvolatile memory device including a nonvolatile memory and a controller unit.

2. Description of Related Art

A NAND flash card is a kind of nonvolatile memory device that enables rewriting, prevents data erasing when the power is turned off and also enables batch erasing. Since NAND flash cards enable downsizing of circuits and thus are suitable for providing large capacity, they have broadly been used as storage devices for digital cameras, portable music players and mobile phones, etc., in recent years.

A NAND flash card includes a NAND flash memory and a controller LSI for the NAND flash memory (see, for example, Japanese Patent Application Laid-Open Publication No. 2006-48777).

The NAND flash memory includes a logic section, an analog section and a memory cell array, and the controller LSI includes a logic section and an analog section.

Here, in the NAND flash memory and the controller LSI, the respective analog sections generate regulator voltages necessary for the respective logic sections, detection signals (reset signals) indicating that an externally-supplied power supply voltage has reached a minimum guaranteed voltage, and operation clocks, and supply the regulator voltages, the detection signal and the operation clocks to the respective logic sections.

Accordingly, the analog section of the NAND flash memory and the analog section of the controller LSI have configurations that provide similar circuit functions (e.g., their respective voltage detecting functions), causing problems in that: the circuit sizes are increased; and also if there is an error in level of detection of a minimum guaranteed voltage between the two voltage detection functions, either the NAND flash memory or the controller LSI will not operate due to such detection error, resulting in the state in which the NAND flash card does not normally operate.

BRIEF SUMMARY OF THE INVENTION

An aspect of the present invention provides a nonvolatile memory device includes a nonvolatile memory and a controller unit for the nonvolatile memory, wherein: the nonvolatile memory and the controller unit include a first logic section and a second logic section, respectively; the nonvolatile memory includes a voltage detector configured to detect an external power supply voltage supplied to both the nonvolatile memory and the controller unit; and a detection output from the voltage detector is supplied to the first logic section of the nonvolatile memory provided with the voltage detector, and also to the second logic section of the controller unit and/or a logic section of at least one added nonvolatile memory via a buffer amplifier, simultaneously.

Another aspect of the present invention provides a nonvolatile memory device includes a nonvolatile memory and a controller unit for the nonvolatile memory, wherein: the nonvolatile memory and the controller unit include a first logic section and a second logic section, respectively; the nonvolatile memory includes a regulator configured to supply a power supply voltage to both of the first and second logic sections of the nonvolatile memory and the controller unit; and the power supply voltage from the regulator is supplied to the first logic section of the nonvolatile memory provided with the regulator, and also to the second logic section of the controller unit and/or a logic section of at least one added nonvolatile memory via a buffer amplifier, simultaneously.

Still another aspect of the present invention provides a nonvolatile memory device includes a nonvolatile memory and a controller unit for the nonvolatile memory, wherein: the nonvolatile memory and the controller unit include a first logic section and a second logic section, respectively; the nonvolatile memory includes an oscillator configured to supply a clock to both of the first and second logic sections of the nonvolatile memory and the controller unit; and the clock from the oscillator is supplied to the first logic section of the nonvolatile memory provided with the oscillator, and also to the second logic section of the controller unit and/or a logic section of at least one added nonvolatile memory via a buffer amplifier, simultaneously.

BRIEF DESCRIPTION OF THE DRAWINGS

FIG. 2A is a circuitry diagram illustrating an example configuration of an output circuit part for a regulator in FIG. 1;

FIG. 2B is a circuitry diagram illustrating an example configuration of an output circuit part for a voltage detector in FIG. 1;

FIG. 2C is a circuitry diagram illustrating an example configuration of an output circuit part for an oscillator in FIG. 1;

FIG. 3 is a circuit diagram illustrating an example configuration of a regulator in FIG. 1;

DETAILED DESCRIPTION OF THE INVENTION

Embodiments of the present invention will be described with reference to the drawings.

Prior to describing embodiments of the present invention with reference to FIGS. 1 to 7, art related to the present invention will be described with reference to FIG. 8. For a nonvolatile memory device, a NAND flash card will be described.

Figure 8:
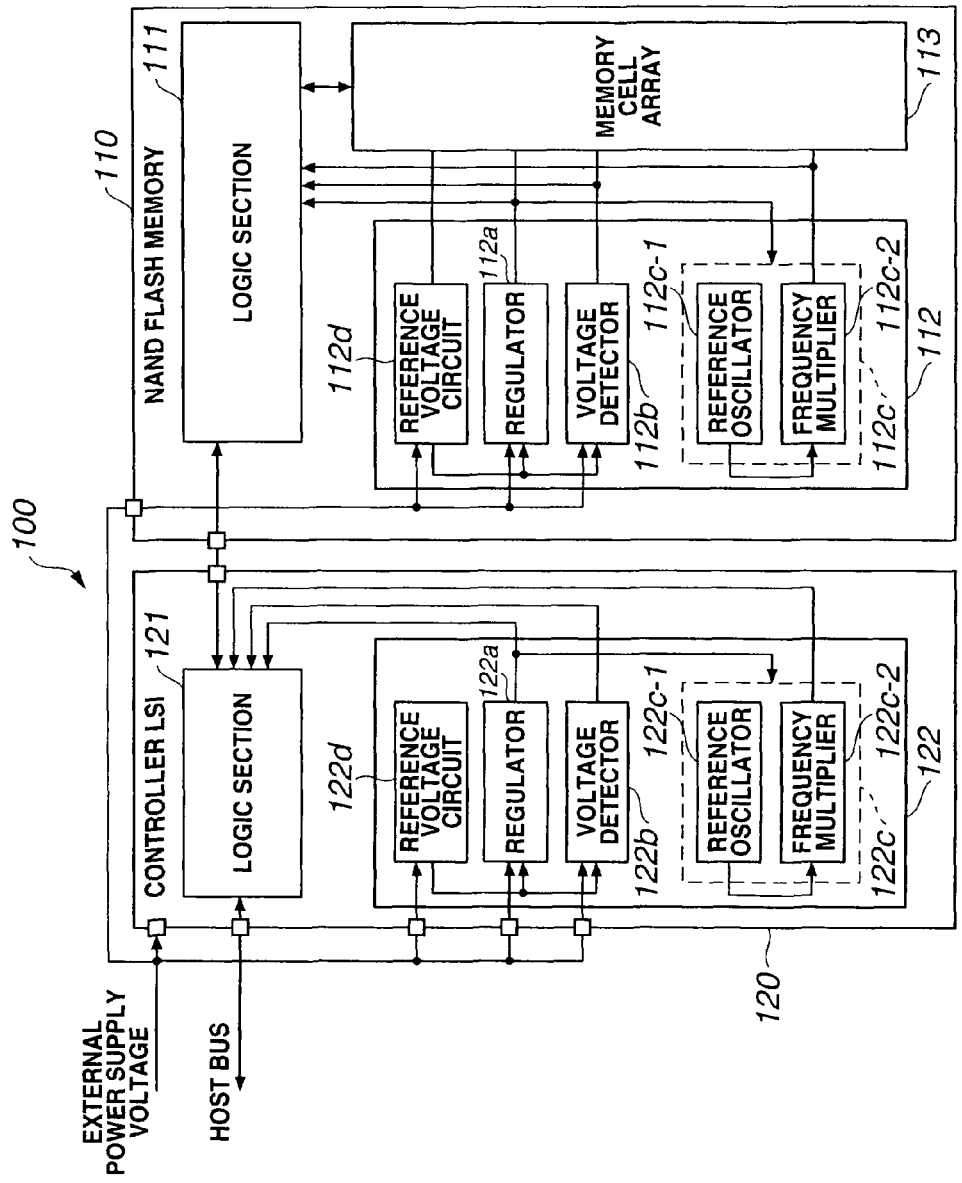
FIG. 8 is a block diagram illustrating a configuration of a NAND flash card according to art related to the present invention.

FIG. 8 is a block diagram illustrating a configuration of a NAND flash card according to art related to the present invention.

As shown in FIG. 8, a NAND flash card 100 includes a NAND flash memory 110, and a controller LSI 120, which is a controller unit for the NAND flash memory 110. The NAND flash memory 110 and the controller LSI 120 are configured of different chips. Small squares (□) shown in the respective chips indicate input circuit parts including input terminals and input buffers or output circuit parts including output buffers and output terminals for power supply voltages and digital signals. The controller LSI 120 functions as a bridge LSI that provides a bridge between a host bus (or a card external terminal) (not shown) through which digital signals are input/output and the NAND flash memory 110 that stores the digital signals.

The controller LSI 120 includes a logic section 121 and an analog section 122.

Here, if the NAND flash card is, e.g., an SD™ card, the logic section 121 has a function that converts the SD™ bus specifications, which are the standards for the input side of the controller LSI 120 to the NAND bus specifications, which are the standards for the output side. Also, the analog section 122 has a function that generates a power supply voltage (regulator voltage), a clock signal and a detection signal (reset signal) indicating that a minimum guaranteed voltage has been detected, which are necessary for operation of the logic section 121, and supplies the power supply voltage, the clock signal and the detection signal to the logic section 121.

The analog section 122 includes: a regulator 122*a* configured to supply a stabilized power supply voltage to the logic section 121; a voltage detector 122*b* configured to detect an external power supply voltage (to be exact, a minimum guaranteed voltage) supplied from the outside of the card; an oscillator 122*c* configured to supply operation clocks to the logic section 121; and a reference voltage circuit 122*d* configured to supply a reference voltage to the regulator 122*a* and the voltage detector 122*b*. The oscillator 122*c* includes a reference oscillator 122*c*-1 and a frequency multiplier 122*c*-2 configured to generate a clock signal based on a reference oscillation signal from the reference oscillator 122*c*-1.

Meanwhile, the NAND flash memory 110 includes a logic section 111, an analog section 112 and a memory cell array 113.

Here, the logic section 111 has a function that, when data is written to the NAND flash memory 110, receives digital signals input according to the NAND bus specifications, which are the standards for the input side of the NAND flash memory 110, and writes the data to the memory cell array 113. Also, the logic section 111 has a function that, when data is read from the NAND flash memory 110, reads the data from the memory cell array 113, converts the read data into digital signals according to the NAND bus specifications and outputs the digital signals. The analog section 112 has a function that generates a power supply voltage (regulator voltage), a clock signal, and a detection signal (reset signal) indicating that a minimum guaranteed voltage has been detected, which are necessary for operation of the logic section 111, and supplies the power supply voltage, the clock signal and the detection signal to the logic section 111.

The analog section 112, as with the analog section 122 of the controller LSI 120, includes: a regulator 112*a* configured to supply a stabilized power supply voltage to the logic section 111 and the memory cell array 113; a voltage detector 112*b* configured to detect an external power supply voltage (to be exact, a minimum guaranteed voltage) supplied from the outside of the card; an oscillator 112*c* configured to supply clocks to the logic section 111 and the memory cell array 113; and a reference voltage circuit 112*d* configured to supply a reference voltage to the regulator 112*a* and the voltage detector 112*b*. The oscillator 112*c* includes a reference oscillator 112*c*-1, and a frequency multiplier 112*c*-2 configured to generate a clock signal based on a reference oscillation signal from the reference oscillator 112*c*-1.

The analog section 122 of the controller LSI 120 are provided with at least (a) a voltage detector 122*b* configured to detect an external power supply voltage supplied from the outside of the card, (b) an oscillator 122*c* configured to supply clocks to the logic section 121, and (c) a regulator 122*a* configured to supply a power supply voltage to the logic section 121, and the analog section 112 of the NAND flash memory 110 also a configuration substantially similar to the configuration of the analog section 122 of the controller LSI 120. Existence of the two similar analog sections in the NAND flash memory 110 and the controller LSI 120 as described above causes the following problems:

(1) The analog sections constitute a factor of an increase in footprint and costs; and
(2) For the voltage detector 122*b* in the controller LSI 120 and the voltage detector 112*b* included in the NAND flash memory 110, either of problems a and b below necessarily occurs as a result of an error occurring between the voltages detected by the voltage detectors 122*b* and 112*b*, that is, a. A card that can guarantee the minimum guaranteed voltage (V ddmin) of the NAND flash memory cannot be manufactured, and
b. the NAND flash memory may operate at a voltage lower than the minimum guaranteed voltage of the NAND flash memory.

These problems a and b will be described in details.

For example, where the voltage detector 112*b* of the NAND flash memory 110 can detect a voltage of no less than 2.7 V, no problem will arise in input of a same external power supply voltage to both of the voltage detectors 112*b* and 122*b* if the voltage detector 122*b* of the controller LSI 120 can detect a voltage of no less than 2.7 V, too, while a problem will arise if there is a manufacturing error between the detection functions of the voltage detectors 112*b* and 122*b*.

In other words, if the NAND flash memory 110 starts operating at a voltage of no less than 2.7 V, it is desirable that the controller LSI 120 also starts operating at a voltage of no less than 2.7 V, but even though an effort is made to start the operation of both the NAND flash memory 110 and the controller LSI 120 at a voltage of no less than 2.7 V, an error attributable to manufacture necessarily occurs between the voltages detected by the voltage detectors 112*b* and 122*b*. Assuming that the voltage detector 122*b* of the controller LSI 120 performs a detection operation at a voltage of no less than 2.5 V and the voltage detector 112*b* of the NAND flash memory 110 performs a detection operation at a voltage of no less than 2.7 V due to an error, a problem will arise when an external power supply voltage, which is input externally, is 2.6 V. When the external power supply voltage is 2.6, the controller LSI 120 starts operating as a result of determining the voltage to be of a sufficient level, but the NAND flash memory 110 does not operate with 2.6 V as a result of determining the voltage not to reach the minimum guaranteed voltage of 2.7 V (i.e., be outside of the guaranteed minimum range). In other words, with the external power supply voltage of 2.6 V, the controller LSI 120 enters an operable state while the NAND flash memory 110 cannot start operating yet. This problem is one corresponding to problem b above.

Meanwhile, contrary to the above, where the controller LSI 120 can operate at a voltage of no less than 2.8 V and the NAND flash memory 110 can operate at 2.7 V, when the external power supply voltage reaches 2.7 V, the NAND flash memory 110 can operate, while the controller LSI 120 cannot operate unless the voltage is further increased to 2.8 V, which requires the outside to provide a large external power supply voltage, resulting in deterioration of the performance of the NAND flash card. This problem corresponds to problem a above.

In summary, where the card has a configuration in which two voltage detectors 112$b$ and 122$b$ are combined, either of problems a and b above will occur as a result of an detection error between the voltage detectors.

Hereinafter, embodiments of the present invention will be described.

First Embodiment

Figure 1:
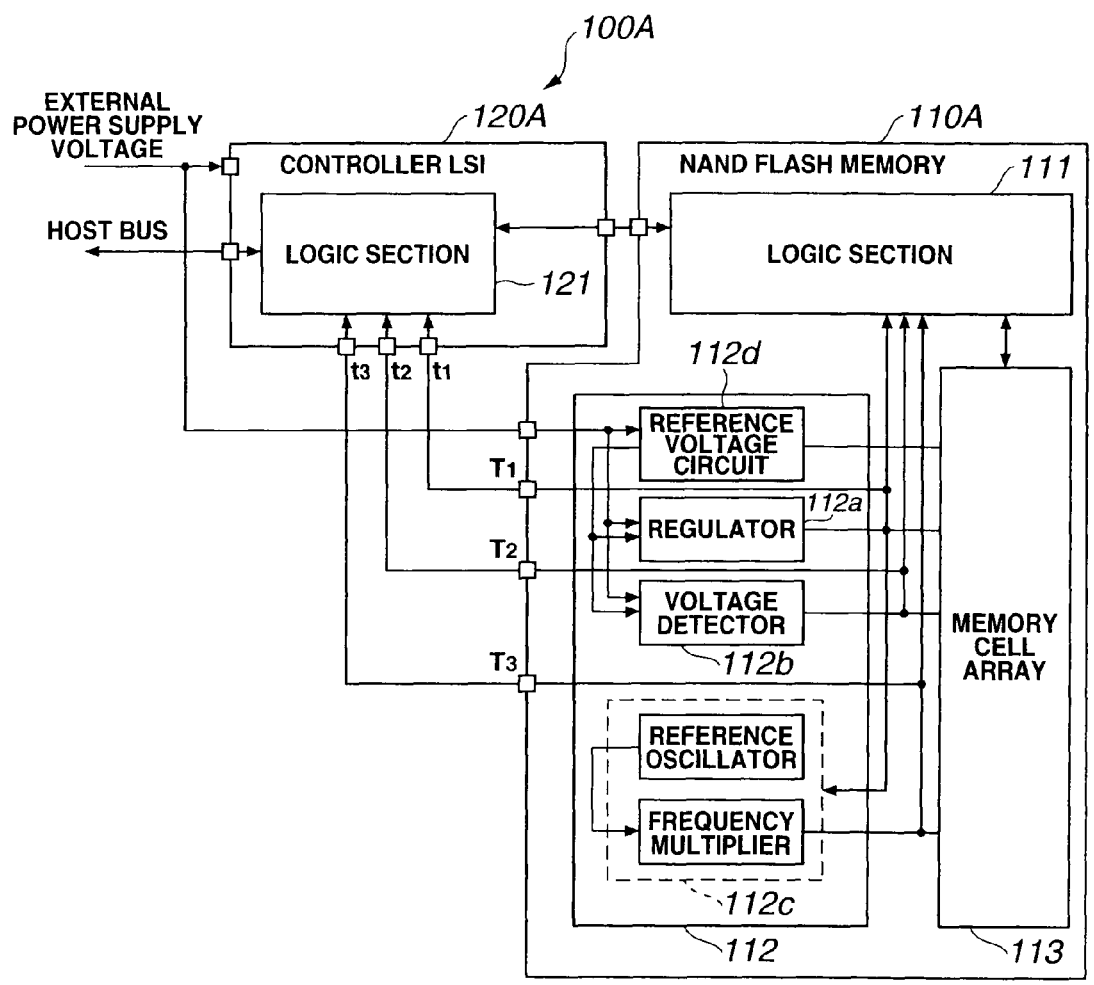
FIG. 1 is a block diagram illustrating a configuration of a NAND flash card according to a first embodiment of the present invention.

FIGS. 1 to 3 relate to a first embodiment of a nonvolatile memory device according to the present invention: FIG. 1 is a block diagram illustrating a configuration of a NAND flash card 100A according to the first embodiment; FIGS. 2A to 2C show example configurations of output circuit parts T1 to T3 in FIG. 1; and FIG. 3 shows an example configuration of a regulator 112$a$ in FIG. 1. The NAND flash card may be, e.g., an SD™ card, a SmartMedia (registered trademark) card, a CompactFlash (registered trademark) or a USB memory card. Here, description will be given in terms of an SD™ card as the NAND flash card.

In the configuration in FIG. 1, the entire analog section 122 in the controller LSI 120 in FIG. 8 has been removed. Accordingly, FIG. 1 shows a configuration in which an analog section 112 in a NAND flash memory 110A doubles as an analog section in a controller LSI 120A. The NAND flash memory 110A and the controller LSI 120A are configured of different chips, and each chip is provided on a wiring pattern of a printed wiring substrate. Small squares (☐) shown in each chip indicate input circuit parts including input terminals and input buffers or output circuit parts including output buffers and output terminals for power supply voltages and digital signals. Here, "buffer" means "buffer amplifier".

More specifically, the controller LSI 120A in FIG. 1 includes a logic section 121 only, and the controller LSI 120A is provided with three input circuit parts t1, t2 and t3 configured to load a regulator voltage from a regulator 112$a$ on the NAND flash memory 110A side, a reset signal, which is a detection output from a voltage detector 112$b$, and a clock signal from an oscillator 112$c$ into the logic section 121. Each of the input circuit parts t1, t2 and t3 includes an input terminal and an input buffer.

Meanwhile, the NAND flash memory 110A has a configuration in which the NAND flash memory 110 in FIG. 8 is provided with three output circuit parts T1, T2 and T3. In other words, the NAND flash memory 110A are provided with three output circuit parts T1, T2 and T3 configured to output a regulator voltage from the regulator 112$a$, a reset signal, which is a detection output from the voltage detector 112$b$, and a clock signal from the oscillator 112$c$ to the outside, respectively. Each of the output circuit parts T1, T2 and T3 includes an output buffer and an output terminal. A logic section 111, an analog section 112 and a memory cell array 113 in the NAND flash memory 110A are similar to those in FIG. 8.

In FIG. 1, a host bus includes a card external terminal part (omitted in the Figure) of the NAND flash card 100A externally connected to an external host device (not shown). A digital signal of 3.3 V at a high level and 0 V at a low level is input to the card external terminal part of the NAND flash card 100A and supplied to the logic section 121 of the controller LSI 120A.

The logic section 121 of the controller LSI 120A has a function that detects whether a signal input from the host bus is at a high level or a low level, and also has a function that converts the SD™ bus specifications, which are the standards for the input side of the controller LSI 120A, to the NAND bus specifications on the output side, which are the standards for the output side.

Meanwhile, the logic section 111 of the NAND flash memory 110A has a function that, when data is written to the NAND flash memory 110, receives digital signals input according to the NAND bus specifications, which are the standards for the input side of the NAND flash memory 110A, and writes the data to the memory cell array 113. The logic section 111 also has a function that, when data is read from the NAND flash memory 110A, reads the data from the memory cell array 113, converts the read data into digital signals according to the NAND bus specifications and outputs the digital signals.

The voltage detector 112$b$ has a function that determines (detects) whether or not a minimum guaranteed voltage (e.g., 2.7 V) necessary for the specifications of an SD™ card is input as an external power supply voltage, and supplies a signal of the detection to the logic section 111 and also to the logic section 121, as a reset signal.

The regulator 112$a$ receives an input of an external power supply voltage of 3.3 V, generates a stabilized voltage of 1.5 V using a reference voltage from a reference voltage circuit 112$d$, and supplies the stabilized voltage to the logic sections 111 and 121. Although the insides of the logic sections 111 and 121 operate at 1.5 V as a power supply voltage, unless the voltage detector 112$b$ detects that the minimum guaranteed voltage (2.7 V) is secured, the logic sections 111 and 121 are not reset, and thus the logic sections 111 and 121 do not start operating.

For the start of operation of the logic sections 111 and 121, even if whether an input signal from the host bus is at a high level or a low level is normally detected in the logic sections 111 and 121, the input signal is not employed as a digital signal of a high level/low level from the host bus in the logic sections 111 and 121 unless the voltage detector 112$b$ detects a voltage equal to or exceeding the minimum guaranteed voltage (2.7 V).

While in the configuration shown in FIG. 1 (and the configurations shown in FIGS. 4 to 7), for a power supply voltage for the oscillator 112$c$ (and an oscillator 122$c$), a regulator voltage from the regulator 112$a$ is used, the external power supply voltage may be used as the power supply voltage for the oscillator 112$c$.

With the above-described configuration, a regulator voltage generated in the regulator 112$a$ in the analog section 112 of the NAND flash memory 110A, a detection signal (reset signal) indicating the detection of a minimum guaranteed voltage, which is output from the voltage detector 112$b$, and a clock signal generated in the oscillator 112$c$ are supplied to the logic sections 111 and 121 simultaneously, and accordingly, problems, such as operation failure, due to an error between two voltages detected by the voltage detector in the controller LSI and the voltage detector included in the NAND flash memory, which occur in the configuration of the related art in FIG. 8, will not occur.

In the configuration shown in FIG. 1, in the chip of the NAND flash memory 110A, the analog section 112 is built on a same semiconductor substrate (wafer) together with the logic section 111 and the memory cell array 113. With this configuration, the logic section 111 and the memory cell array 113 in NAND flash memory 110A, especially the memory cell array 113, require voltages, such as a bias voltage for driving memory cells to perform writing/reading, to be set (controlled) with a high degree of accuracy. Thus, the analog section 112, which supplies a regulator voltage and a clock signal to the memory cell array 113, requires a high degree of accuracy as the memory cell array 113 and the logic section 111 do.

Meanwhile, the logic section 121 in the chip of the controller LSI 120A mainly functions to convert the SD™ bus specifications to the NAND bus specifications, and thus does not require setting, e.g., a voltage with a high degree of accuracy, which is necessary for controlling the memory cell array 113. Accordingly, if an analog section 112 is provided in the chip of the controller LSI 120A, the analog section 112 would not require a high degree of accuracy either. In other words, while the chip of the NAND flash memory 110A is required to be manufactured with a high degree of accuracy, the chip of the controller LSI 120A is less required to be manufactured with a high degree of accuracy compared to the NAND flash memory 110A.

Accordingly, when the configuration of the NAND flash card of the related art in FIG. 8 is changed to include only one analog section, it is preferable to employ the configuration shown in FIG. 1, which uses the analog section 112 of the NAND flash memory 110A also as an analog section of the controller LSI 120A. The reason is that since mounted-circuit portions of the NAND flash memory 110A (i.e., the memory cell array 113 and the logic section 111) essentially require a high degree of accuracy, use of the analog section 112 on the NAND flash memory 110A side, which is required to be manufactured with a high degree of accuracy corresponding to these mounted-circuit portions enables supply of a regulator voltage, a rest signal and a clock signal with a necessary degree of accuracy or higher from the analog section 112 to the controller LSI 120A, and consequently enables supply of a regulator voltage, a reset signal and a clock signal with a necessary degree of accuracy or higher to both the NAND flash memory 110A and the controller LSI 120A.

FIGS. 2A, 2B and 2C show example configurations of the output circuit parts T1, T2 and T3, respectively.

Each of the output circuit parts T1, T2 and T3 includes an output buffer as an impedance conversion element that performs impedance conversion so that the effect of the outside of the NAND flash memory 110A does not reach the internal circuits, and an output terminal. FIG. 2A shows the output circuit part T1 including a voltage follower T1-1 as an impedance conversion element that guides a regulator output of the regulator 112a to an output terminal T1-2, and the output terminal T1-2. FIG. 2B shows the output circuit part T2 including a serial circuit T2-1 of two inverters as an impedance conversion element that guides a detection output (reset signal) of the voltage detector 112b to an output terminal T2-2, and the output terminal T2-2. FIG. 2C shows the output circuit part T3 including a serial circuit T3-1 of two inverters as an impedance conversion element that guides a clock output of the oscillator 112c to an output terminal T3-2, and the output terminal T3-2. When a reference voltage from the reference voltage circuit 112d (or 122d) is output to the outside, the configuration of the voltage follower in FIG. 2A may be used.

Each of the input circuit parts t1, t2 and t3 includes an input terminal, and an input buffer as an impedance conversion element that performs impedance conversion so that the effect of the outside does not reach the internal circuits. The input buffers in this case have configurations similar to those of the output buffers shown in FIGS. 2A to 2C.

FIG. 3 shows an example configuration of the regulator 112a.

An external power supply voltage of, e.g., 3.3 V is supplied to a drain (D) of a junction-type FET Q1. A serial circuit of a resistance R1 and a resistance R2 is connected between a source (S) of the FET Q1 and a reference potential point, a voltage at the point of the serial connection is input to a positive input terminal of an operational amplifier OP1, and a reference voltage of 1.0 V from the reference voltage circuit 112d is input to a negative input terminal of the operational amplifier OP1. For the reference voltage circuit 112d, e.g., a constant voltage diode is used, and even though a direct current power supply E varies between 1.2 to 4.0 V, a reference voltage of 1.0 V can constantly be generated.

When the FET Q1 is turned off when a voltage input to a gate (G) of the FET Q1 is a predetermined negative voltage lower than 0 V (e.g., −1.5 V), and a voltage larger than the predetermined voltage is supplied to the gate of the FET Q1, a current between the source and the drain is increased (e.g., the conduction resistance is lowered), enabling a voltage output to the source when a difference in voltage between the gate and the source is 0 V to be stabilized at 1.5 V. The regulator voltage of 1.5V, as described above, is used as a power supply voltage for the logic sections 111 and 121 (also for the memory cell array 113 and the oscillator 112c).

According to the present embodiment, the analog section of the controller LSI can be removed, saving the area of the analog section as well as providing the advantage of cost reduction. Also, a reset signal is supplied only from the voltage detector on the NAND flash memory side to the logic section of the controller LSI, and accordingly, problems, such as operation failure, due to an error between two voltages detected by the voltage detector in the controller LSI and the voltage detector included in the NAND flash memory, which occurs in the configuration shown in FIG. 8, do not occur. Furthermore, a regulator voltage, a rest signal and a clock signal with a high degree of accuracy can be supplied to both the NAND flash memory and the controller LSI.

Second Embodiment

Figure 4:
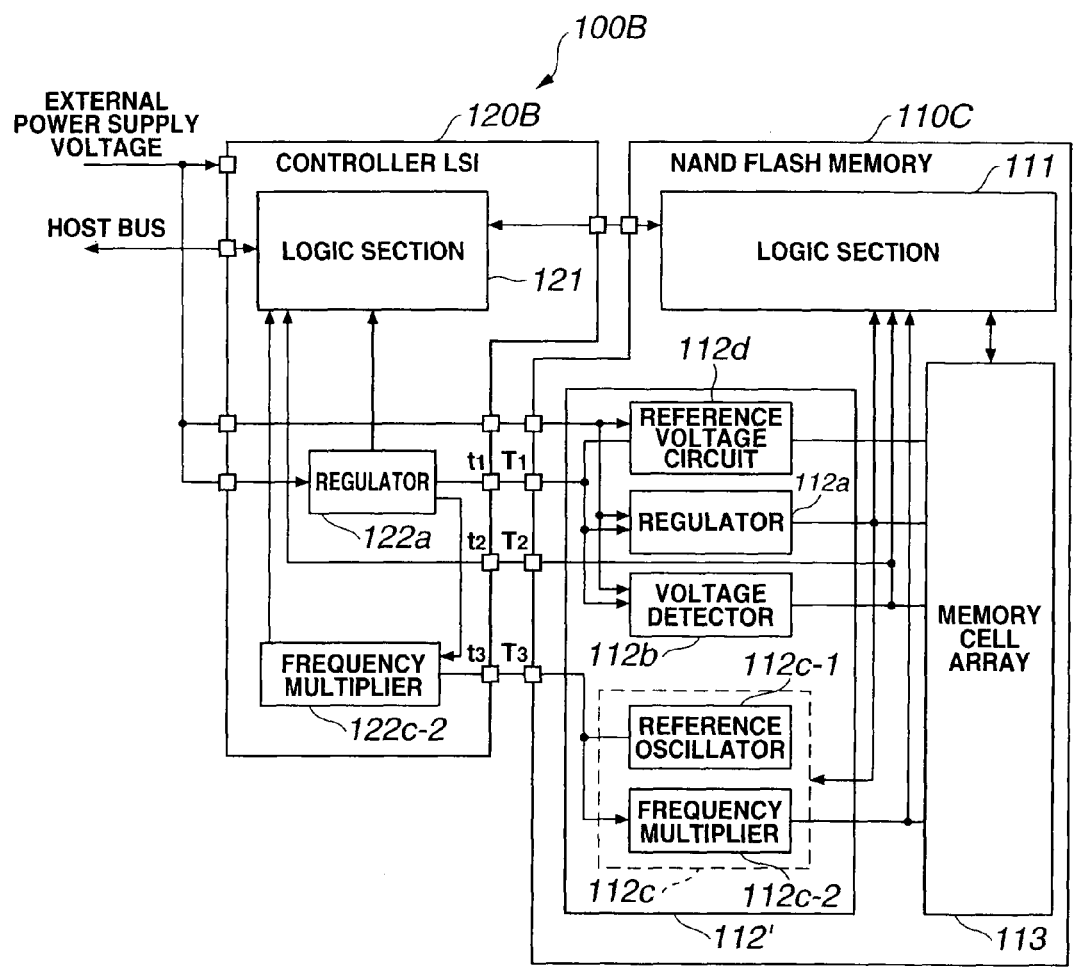
FIG. 4 is a block diagram illustrating a configuration of a NAND flash card according to a second embodiment of the present invention.

FIG. 4 is a block diagram illustrating a configuration of a NAND flash card 100B according to a second embodiment of the present invention.

In the first embodiment shown in FIG. 1, a configuration in which the NAND flash memory 110A supplies a regulator voltage, a reset signal and a clock signal to the controller LSI 120A has been described.

In the second embodiment shown in FIG. 4, the analog section of the controller LSI 120 in FIG. 8 has partially been removed. In other words, the second embodiment is configured so that: the reference voltage circuit 122d, the voltage detector 122b and the reference oscillator 122c-1 are removed from the analog section 122 of the controller LSI 120 in the NAND flash card 100 in FIG. 8, while the regulator 122a and the frequency multiplier 122c-2 are retained; and a regulator voltage, a reset signal and a clock signal necessary for the logic section 121 of the controller LSI 120 are obtained from the regulator 122a and the frequency multiplier 122c-2, which are retained in the controller LSI 120, and the reference voltage circuit 112d, the voltage detector 112b and the reference oscillator 112c-1 in the analog section 112 of the NAND flash memory 110.

Unlike the configuration in FIG. 1, a reference voltage of a reference voltage circuit 112d in the NAND flash card 100B is output to the outside via an output circuit part T1, and then supplied to a regulator 122a of a controller LSI 120B via an input circuit part t1. The regulator 122a generates a regulator voltage using an external power supply voltage and a reference voltage from the input circuit part t1, and supplies the regulator voltage to a logic section 121. Also, reference clocks from a reference oscillator 112c-1 in an oscillator 112c in the NAND flash card 100B are output to the outside via an output circuit part T-3, and then supplied to a frequency multiplier 122c-2 in the controller LSI 120B via an input circuit part t3. The frequency multiplier 122c-2 generates a clock signal by multiplying the frequency of the reference clocks and supplies the clock signal to the logic section 121. Also, a detection output (reset signal) from a voltage detector 112b in the NAND flash card 100B is supplied to the logic section 121 of the controller LSI 120B via an output circuit part T2 and an input circuit part t2.

The above configuration is different from the first embodiment in FIG. 1 in that: the analog section of the controller LSI 120B has partially been removed and an analog section 112' of a NAND flash memory 110C doubles as the removed portion of the analog section of the controller LSI 120B. The NAND flash memory 110C and the controller LSI 120B are configured of different chips, and each chip is provided on a wiring pattern on a printed wiring substrate.

Advantages of the configuration in FIG. 4 over the configuration in FIG. 1 will be described. In the case of the configuration in FIG. 1, it is necessary to obtain a high-frequency clock signal (frequency multiplier output) necessary for the chip of the controller LSI from the chip of the NAND flash memory. Then, the part of connection between the NAND flash memory 110C and the controller LSI 120B is on the printed wiring substrate where a large capacity is provided, increasing the current consumption.

Meanwhile, in the case of the configuration in FIG. 4, since the frequency multiplier 122c-2 is retained in the controller LSI 120B, the frequency of a signal received by the controller LSI 120B from the NAND flash memory 110C is a substantially-low frequency from the reference oscillator (which is substantially lower compared to the multiplied frequency from the frequency multiplier), and since the frequency of a signal transmitted in the wiring pattern on the printed wiring substrate is low being the frequency of the reference oscillator, a substantially smaller amount of current is consumed in that portion compared to the case of use of the multiplied frequency. Also, there is an advantage of the frequency multiplier 122c-2 exiting in the controller LSI 120B in that the frequency of a clock signal can be changed between the controller LSI 120B and the NAND flash memory 110C separately. In other words, by means of changing a multiple for the frequency multiplier 112c-2 of the NAND flash memory 110C and a multiple for the frequency multiplier 122c-2 of the controller LSI 120B, the frequency of a clock signal on the NAND flash memory 110C side and the frequency of a clock signal on the controller LSI 120B side can be changed separately.

Furthermore, since the regulator 122a is retained in the controller LSI 120B, the regulator voltage in the logic section 121 can easily be changed variously (e.g., the regulator voltage can easily be changed to a low voltage aiming at current consumption) as needed. In other words, the voltage of the regulator on the controller LSI 120B side can be adjusted. It should be understood that the regulator voltage of a logic section 111 of the NAND flash memory 110C can also be adjusted separately, and thus, voltages can separately be set in the regulator 122a in the controller LSI 120B and the regulator 122a in the NAND flash memory 110C. In the configuration in FIG. 4, compared to the related art in FIG. 8, the NAND flash memory 110C includes a reference oscillator and a reference voltage circuit, and only reference clocks and a reference voltage are supplied to the frequency multiplier 122c-2 and the regulator 122a in the controller LSI 120B, respectively, providing an advantage in that it is sufficient to provide one reference oscillator and one reference voltage circuit, which are difficult to provide in terms of design.

According to the present embodiment, the analog section of the controller LSI can partially be removed, reducing the area of the analog section and providing the advantage of cost reduction. Also, a reset signal is supplied from the voltage detector on the NAND flash memory side to the controller LSI in common with the logic section of the NAND flash memory, and thus, problems, such as operation failure, due to an error between voltages detected by the voltage detector in the controller LSI and the voltage detector included in the NAND flash memory, which occurs in the configuration in FIG. 8, do not occur. Furthermore, as described above, different clock signal frequencies and regulator voltages can be set between the NAND flash memory and the controller LSI. Also, the current consumption can be reduced by conveying a low signal frequency of clocks from the reference oscillator on the NAND flash memory side to the controller LSI side.

Third Embodiment

Figure 5:
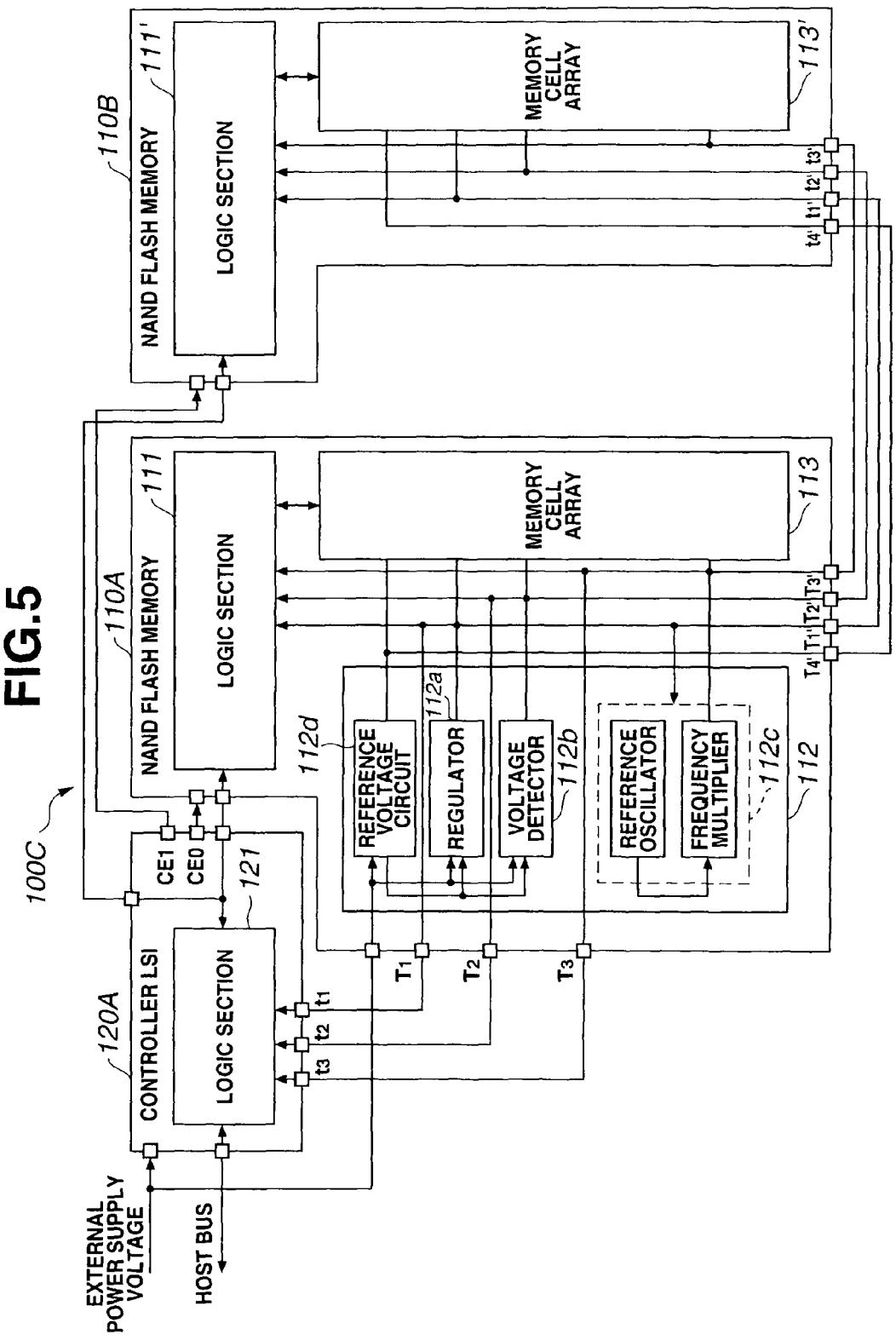
FIG. 5 is a block diagram illustrating a configuration of a NAND flash card according to a third embodiment of the present invention.

FIG. 5 is a block diagram illustrating a configuration of a NAND flash card 100C according to a third embodiment of the present invention.

The third embodiment shown in FIG. 5 is configured so that when a NAND flash card including a plurality of NAND flash memories is provided, a regulator voltage, a reset signal and a clock signal are output from one NAND flash memory, and supplied also to the other NAND flash memories.

The third embodiment shown in FIG. 5 has a configuration in which one or more NAND flash memories 110B (one NAND flash memory in the Figure) each including a logic section and a memory cell array, which is obtained by removing the analog section from the NAND flash card 100A shown in FIG. 1, is added. A plurality of NAND flash memories 110B may be added to a NAND flash card 100A in parallel. Where one or more NAND flash memories 110B are connected to the NAND flash card 100A in parallel, output circuit parts T1', T2', T3' and T4' and input circuit parts t1', t2', t3' and t4' are provided to lines for a regulator voltage, a clock signal, a reset signal and a reference voltage. As a result of adding one or more NAND flash memories 110B as described above, a NAND flash card with a large capacity can be provided.

Data according to the NAND bus specifications output from a logic section 121 of a controller LSI 1 20A is supplied to a logic section 111 of a first NAND flash memory 110A, and can also be supplied to a logic section 111' of a second NAND flash memory 110B. Also, chip enable signals CE0 and CE1 can be output from the controller LSI 120A, the first NAND flash memory 110A can be selected by the chip enable signal CE0, and the second NAND flash memory 110B can be selected by the chip enable signal CE1. Normally, the first NAND flash memory 110A is selected, and when the storage capacity of the memory cell array in the first NAND flash memory 110A has been filled, the second NAND flash memory 110B is selected and thereby storing can be continued.

More specifically, by means of one logic section 121 included in the controller LSI 120A, a plurality of logic section-memory cell array pairs, each pair including a logic section 111 and a memory cell array 113, can selectively be controlled to operate, and by means of one analog section 112 included in the NAND flash memory 110A, a regulator voltage, a reset signal, a clock signal and a reference voltage necessary for the plurality of logic section-memory cell array pairs, each pair including a logic section 111 and a memory cell array 113, can be supplied.

According to the present embodiment, a regulator voltage, a reset signal and a clock signal generated in one NAND flash memory can be supplied also to the one or more other NAND flash memories with no analog sections, and thus even thought the storage capacity of one NAND flash memory has been filled with data, the used flash memory can be switched to another NAND flash memory connected in parallel to store data. Consequently, analog sections can be reduced and the storage capacity can be increased.

Fourth Embodiment

Figure 6:
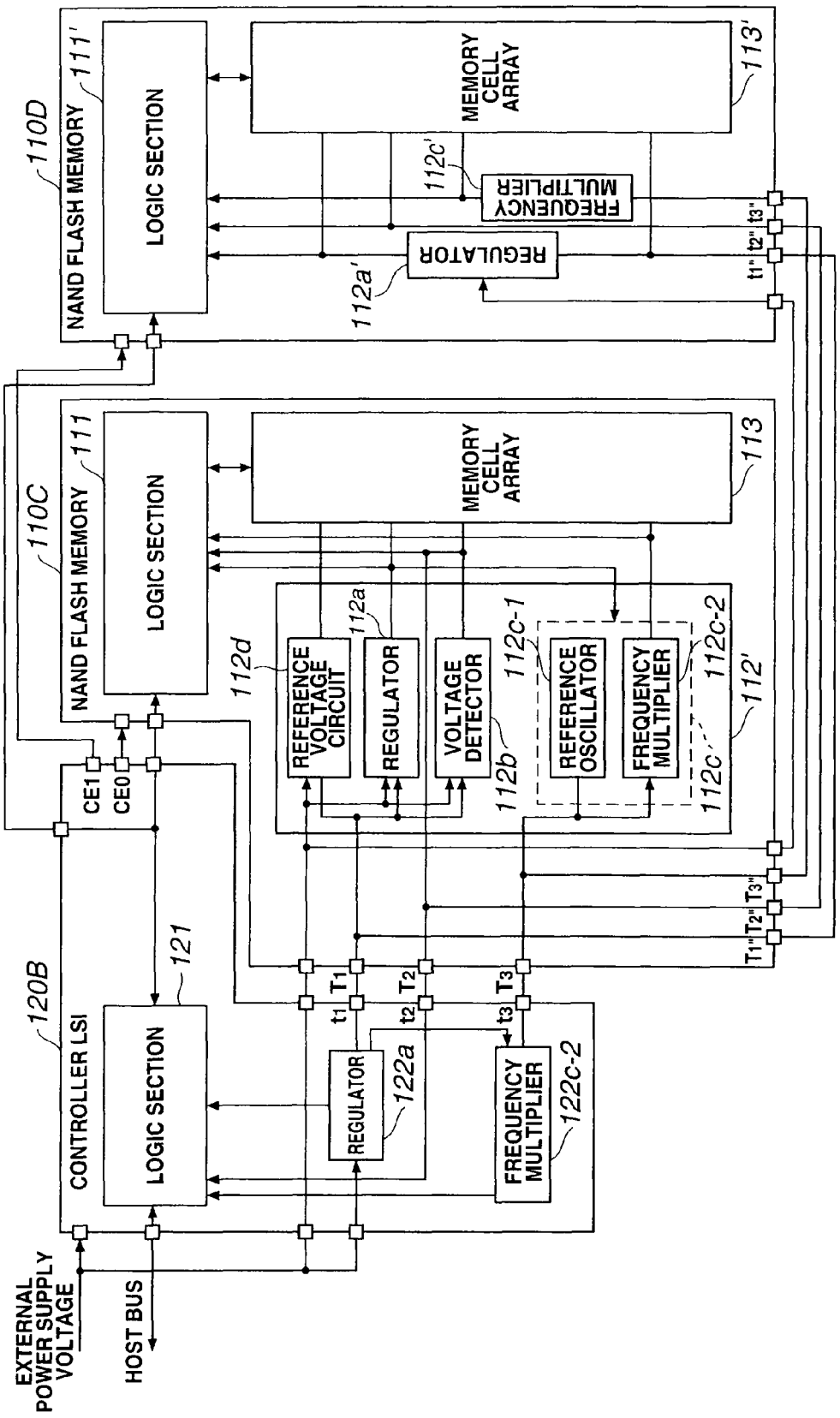
FIG. 6 is a block diagram illustrating a configuration of a NAND flash card according to a fourth embodiment of the present invention.

FIG. 6 is a block diagram illustrating a configuration of a NAND flash card 100D according to a fourth embodiment of the present invention.

The fourth embodiment shown in FIG. 6 is configured so that when a NAND flash card including a plurality of NAND flash memories is provided, a reference voltage, a reset signal and reference clocks are output from one NAND flash memory 110C and supplied also to the other NAND flash memories 110D.

The fourth embodiment shown in FIG. 6 has a configuration in which one or more NAND flash memories 110D (one NAND flash memory 110D in the Figure) each including a logic section 111', a memory cell array 113', and a regulator 112a' and a frequency multiplier 112c' as an analog section are added to the NAND flash card 100B shown in FIG. 4. A plurality of NAND flash memories 110D may be added to the NAND flash card 100B (see FIG. 4) in parallel. When one or more NAND flash memories 110D are connected to the NAND flash card 100B in parallel, output circuit parts T1", T2" and T3" and input circuit parts t1", t2" and t3" are provided to lines for a reference voltage, a reset signal and reference clocks. As a result of adding one or more NAND flash memories 110D, a NAND flash card with a large capacity can be provided. An external power supply voltage is supplied to the regulators 112a' in the NAND flash memories 110D via, e.g., a controller LSI 120B, the NAND flash memory 110C and external wirings.

Data according to the NAND bus specifications output from a logic section 121 of the controller LSI 120B is supplied to a logic section 111 of a first NAND flash memory 110C, and can also be supplied to a logic section 111' of a second NAND flash memory 110D. Furthermore, chip enable signals CE0 and CE1 can be output from the controller LSI 120B, the first NAND flash memory 110C can be selected by the chip enable signal CE0, and the second NAND flash memory 110D can be selected by the chip enable signal CE1. Normally, the first NAND flash memory 110C is selected, and when the storage capacity of the memory cell array of the first NAND flash memory 110C has been filled, the second NAND flash memory 110D is selected and thereby storing can be continued.

More specifically, by means of a logic section 121, a regulator 122a and a frequency multiplier 122c-2 included in the controller LSI 120B, a NAND flash memory 110C including a set of a logic section 111, a memory cell array 113 and the analog section 112', and the NAND flash memories 110D including one or more sets of a logic section, a memory cell array, a regulator and a frequency multiplier can be selectively controlled to operate, and by means of the analog section 112' included in the NAND flash memory 110C, a reference voltage, a rest signal, a reference clock and an external power supply voltage necessary for the one or more sets of a logic section, a memory cell array, a regulator and a frequency multiplier, each set including the logic section 111', the memory cell array 113', the regulator 112a' and the frequency multiplier 112c', can be supplied.

According to the present embodiment, a configuration in which a reference voltage, a reset signal and a reference clock generated in one NAND flash memory is supplied also to one or more other NAND flash memories each having only a regulator and a frequency multiplier as an analog section can be provided, enabling providing a plurality of NAND flash memories in which a regulator voltage and a clock signal can be adjusted by means of the regulator and the frequency multiplier to a NAND flash card. Consequently, even though the storage capacity of one NAND flash memory has been filled with data, data can be stored by switching the used flash memory to another NAND flash memory connected in parallel. As a result, the areas of the analog sections can be reduced and the storage capacity can be increased.

Fifth Embodiment

Figure 7:
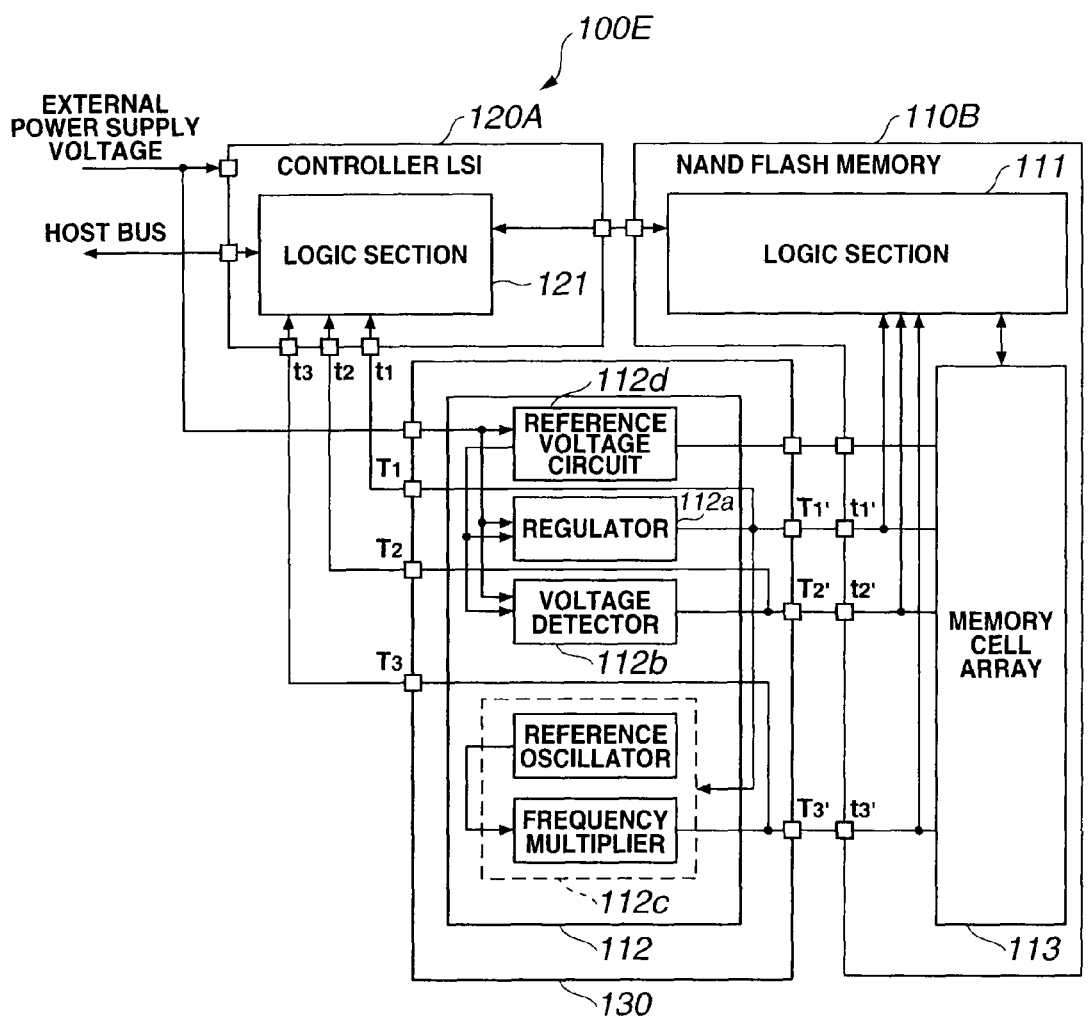
FIG. 7 is a block diagram illustrating a configuration of a NAND flash card according to a fifth embodiment of the present invention.

FIG. 7 is a block diagram illustrating a NAND flash card E according to a fifth embodiment of the present invention.

The fifth embodiment shown in FIG. 7 has a configuration in which the analog section 112 of the NAND flash memory 110A in the embodiment in FIG. 1 has been taken out of the NAND flash memory 110A and separated off as an analog section block 130, which is another chip.

The above-described output circuit parts T1, T2 and T3 and input circuit parts t1, t2 and t3, which are configured to output a necessary regulator voltage, voltage detector 112b's detection signal (rest signal) and clock signal from an oscillator 112c from an analog section 112 to a logic section 121, are provided to lines between the analog section 112 and the logic section 121 of a controller LSI 120A. Also, the output circuit parts T1', T2' and T3' and input circuit parts t1', t2' and t3' are provided to lines between the analog section 112 and a memory cell array 113.

Where the above-described configuration is applied to, e.g., the NAND flash memory 110A in the NAND flash card 100C in FIG. 5 including two NAND flash memories, the NAND flash memory 110A (see FIG. 5) is divided into a NAND flash memory 110B (see FIG. 7) and an analog section block 130 (see FIG. 7), the configurations of two NAND flash memories 110A and 110B in FIG. 5 are all made to be a simple configuration that only includes a logic section and a memory cell array, providing an advantage in facilitating circuit design and circuit chip manufacture. In other words, in FIG. 5, the NAND flash card 100C can be configured of a controller LSI 120A, an analog section block 130, two NAND flash memories 110B having no analog sections. Similarly, when a NAND flash card including N (N is an integer no less than two) NAND flash memories is configured, such NAND flash card can be configured by a controller LSI 120A, an analog section block 130 and N NAND flash memories 110B having no analog sections, facilitating circuit design and circuit chip manufacture.

The present invention is limited neither to NAND flash cards, nor to SD™ cards, and can broadly be applied to nonvolatile memory devices including a storage portion and a control portion.

As described above, the present invention enables downsizing of circuits as a result of reducing analog sections, and also enables provision of a nonvolatile memory device that does not cause problems such as operation failure due to an error between two voltages detected by a voltage detector used in a controller unit and a voltage detector included in a nonvolatile memory. The present invention further enables elimination of not only a detection error between a voltage detector in a nonvolatile memory and a voltage detector in a controller unit for the nonvolatile memory, but also an error between regulator voltages and an error between operation clocks. Furthermore, the present invention enables reduction of current consumption, an increase in storage capacity, and a facilitation of circuit design and circuit chip manufacture.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A nonvolatile memory device comprising a nonvolatile memory and a controller unit for the nonvolatile memory, wherein:
   the nonvolatile memory and the controller unit include a first logic section and a second logic section, respectively;
   the nonvolatile memory includes a voltage detector configured to detect an external power supply voltage supplied to both the nonvolatile memory and the controller unit; and
   a detection output from the voltage detector is supplied to the first logic section of the nonvolatile memory provided with the voltage detector, and also to the second logic section of the controller unit and/or a logic section of at least one added nonvolatile memory via a buffer amplifier, simultaneously.

2. The nonvolatile memory device according to claim 1, wherein the voltage detector includes a function that detects whether or not a minimum guaranteed voltage necessary for the nonvolatile memory is input as an external power supply voltage; and the voltage detector supplies a signal of the detection to both the first and second logic sections as a reset signal.

3. The nonvolatile memory device according to claim 2, wherein the first and second logic sections can operate using a predetermined stabilized voltage from the regulator as a power supply voltage, while unless the voltage detector detects that a predetermined minimum guaranteed voltage, which is higher than the stabilized voltage, is secured, the first and second logic sections are not reset, and the first and second logic sections do not start operating.

4. The nonvolatile memory device according to claim 1, wherein for start of operation of the first and second logic sections, even if whether an input signal from a host bus is at a high level or a low level is normally detected in the first and second logic sections, the input signal is not employed as a digital signal of a high level/low level from the host bus in the first and second logic sections unless the voltage detector detects a voltage equal to or exceeding a predetermined minimum guaranteed voltage.

5. The nonvolatile memory device according to claim 3, wherein for start of operation of the first and second logic sections, even if whether an input signal from a host bus is at a high level or a low level is normally detected in the first and second logic sections, the input signal is not employed as a digital signal of a high level/low level from the host bus in the first and second logic sections unless the voltage detector detects a voltage equal to or exceeding the predetermined minimum guaranteed voltage.

* * * * *